(12) United States Patent  
Morita

(10) Patent No.: US 10,468,580 B2  
(45) Date of Patent: Nov. 5, 2019

(54) BULK OXIDE SUPERCONDUCTOR AND METHOD OF PRODUCTION OF BULK OXIDE SUPERCONDUCTOR

(71) Applicant: NIPPON STEEL & SUMITOMO METAL CORPORATION, Tokyo (JP)

(72) Inventor: Mitsuru Morita, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 0 days.

(21) Appl. No.: 15/113,879

(22) PCT Filed: Mar. 24, 2015

(86) PCT No.: PCT/JP2015/058947  
§ 371 (c)(1),  
(2) Date: Jul. 25, 2016

(87) PCT Pub. No.: WO2015/146993  
PCT Pub. Date: Oct. 1, 2015

(65) Prior Publication Data  
US 2016/0351779 A1 Dec. 1, 2016

(30) Foreign Application Priority Data  
Mar. 24, 2014 (JP) ................. 2014-060416

(51) Int. Cl.  
*H01L 39/12* (2006.01)  
*H01L 39/24* (2006.01)

(52) U.S. Cl.  
CPC ........ *H01L 39/126* (2013.01); *H01L 39/2483* (2013.01)

(58) Field of Classification Search  
CPC .... H01F 6/06; G01R 33/3804; G01R 33/3815  
See application file for complete search history.

(56) References Cited

U.S. PATENT DOCUMENTS

| | | | |
|---|---|---|---|
| 5,474,976 A | 12/1995 | Kondoh et al. | |
| 5,547,921 A | 8/1996 | Tani et al. | |

FOREIGN PATENT DOCUMENTS

| | | |
|---|---|---|
| EP | 0 374 263 A1 | 6/1990 |
| JP | 2-153803 A | 6/1990 |
| JP | 5-193938 A | 8/1993 |

(Continued)

OTHER PUBLICATIONS

Machine translation of JP 2005-289684 (2005).*

(Continued)

*Primary Examiner* — Paul A Wartalowicz  
(74) *Attorney, Agent, or Firm* — Birch, Stewart, Kolasch & Birch, LLP

(57) ABSTRACT

The present invention has as its problem the provision of a bulk oxide superconductor which has a high workability and high critical current density characteristic regardless of the external conditions and solves the problem by limiting the amount of addition of Ag to 5 mass % or less, using the QMG method to produce a bulk superconductor and thereby obtain a single crystal-like bulk superconductor of a structure with parts where Ag particles are present and parts where Ag particles are not present made to adjoin each other.

2 Claims, 3 Drawing Sheets

SUPERCONDUCTING BULK MATERIAL GROWN FROM SEED CRYSTAL (a)

STATE OF CROSS-SECTION AT POSITION OF BROKEN LINE (b)

(56) References Cited

FOREIGN PATENT DOCUMENTS

| | | | |
|---|---|---|---|
| JP | 5-279031 | A | 10/1993 |
| JP | 5-279034 | A | 10/1993 |
| JP | 7-277730 | A | 10/1995 |
| JP | 2004-161504 | A | 6/2004 |
| JP | 2005-289684 | A | 10/2005 |
| JP | 2007-131510 | A | 5/2007 |

OTHER PUBLICATIONS

International Search Report (PCT/ISA/210) issued in PCT/JP2015/058947, dated Jun. 23, 2015.
Nakamura et al., "Phase relation in Y211—Y123—Ag system and morphology of silver in Y123 crystal", Physica C, vol. 294, 1998, pp. 302-315.
Written Opinion (PCT/ISA/237) issued in PCT/JP2015/058947, dated Jun. 23, 2015.

* cited by examiner

SUPERCONDUCTING BULK MATERIAL
GROWN FROM SEED CRYSTAL (a)

STATE OF CROSS-SECTION
AT POSITION OF BROKEN LINE (b)

SUPERCONDUCTING BULK MATERIAL
CONTAINING SILVER 5 MASS%
GROWN FROM SEED CRYSTAL (a)

STATE OF
CROSS-SECTION
AT POSITION OF
BROKEN LINE A (b)

STATE OF
CROSS-SECTION
AT POSITION OF
BROKEN LINE B (c)

SUPERCONDUCTING BULK MATERIAL
CONTAINING SILVER 3 MASS%
GROWN FROM SEED CRYSTAL
(DIAMETER ABOUT 37mm)

(a)

STATE OF CROSS-SECTION
AT 5 AND 10mm POSITIONS
FROM TOP (b)

(c)

(a) SUPERCONDUCTING BULK MATERIAL CONTAINING SILVER 4 MASS% GROWN FROM SEED CRYSTAL (DIAMETER ABOUT 45mm)

(b) STATE OF CROSS-SECTION AT 5 AND 10mm POSITIONS FROM TOP (c)

BULK OXIDE SUPERCONDUCTOR AND METHOD OF PRODUCTION OF BULK OXIDE SUPERCONDUCTOR

TECHNICAL FIELD

The present invention relates to a bulk oxide superconductor having a high workability and high critical current density and to a method of production of a bulk oxide superconductor.

BACKGROUND ART

An RE-based bulk oxide superconductor produced by the so-called "melt" method, that is, a rare-earth-based oxide superconductor where $RE_2BaCuO_5$ (211) phases are finely dispersed in a single crystal-like $REBa_2Cu_3O_{7-x}$ (here, "RE" is one or more rare earth elements including Y), has a larger magnetic flux pinning force compared with other oxide superconductors. In particular, it has a high critical current density even at a high temperature near the liquid nitrogen temperature (77K), so utilization for bulk magnets, magnetic levitation systems, current leads, and various other fields of application can be expected. To such a bulk material, fine amounts of Pt, Rh, Ce, etc. are added to thereby refine the $RE_2BaCuO_5$ phases to about 1 μm.

For example, the melt method such as the QMG (Quench and Melt Growth) method disclosed, in PLTs 1, 2, 3, etc. is a technique which once raises the temperature to a temperature region where the $RE_2BaCuO_5$ phases or $RE_4Ba_2Cu_2O_{10}$ phases and a liquid phase mainly comprised of B—Cu—O can be copresent, cools to right above the peritectic temperature where $REBa_2Cu_3O_{7-x}$ (123) is formed, and gradually cools from that temperature to cause crystal growth, controls the nucleation and crystal orientation, and obtains a large-sized bulk material comprised of single crystal grains. Further, by adding Ag to a shaped article including $REBa_2Cu_3O_{7-x}$, $RE_2BaCuO_5$, and other materials, a bulk material in which several μm to several hundred μm of Ag particles are dispersed is obtained. A material to which Ag is added is superior in machineability with less chipping due to machining compared with a material to which it is not added. Further, near the boiling point (77K) of liquid nitrogen, in a Y-based material or Gd-based material, the critical current tends to become larger.

The seeding method using a seed crystal with a high peritectic temperature to cause crystal growth disclosed in PLT 2 uses a $RE2Ba_2Cu_3O_{7-x}$ single crystal-like sample with a higher melting point (peritectic temperature) than the $RE1Ba_2Cu_3O_{7-x}$-based oxide superconductor which the seed crystal tries to produce. This method of production of a single crystal bulk heats the starting precursor of the $RE1Ba_2Cu_3O_{7-x}$-based oxide superconductor to an intermediate temperature between the peritectic temperature of $RE1Ba_2Cu_3O_{7-x}$ and the peritectic temperature of $RE2Ba_2Cu_3O_{7-x}$ whereby the $RE1Ba_2Cu_3O_{7-x}$ breaks down resulting in a $RE1_2BaCuO_5$ phase or $RE1_4Ba_2Cu_2O_{20}$ phase and a liquid phase mainly comprised of Ba—Cu—O in a copresent state and brings one surface of the $RE2Ba_2Cu_3O_{7-x}$ crystal in contact with the precursor. After this, this is cooled to the peritectic temperature of $RE1Ba_2Cu_3O_{7-x}$ to cause the formation of $RE1Ba_2Cu_3O_{7-x}$ and then is gradually cooled near the peritectic temperature to thereby grow crystal at the same orientation as the crystal orientation of the contact surface of the $RE2Ba_2Cu_3O_{7-x}$.

To disperse Ag in a single crystal-like bulk, Ag is usually added in about 10 to 20 mass %. NPLT 1 discloses Y-based materials in which 3, 5, 7, 10, 15, 20 mass % of Ag are added and shows the presence of any crystal growth, structures, etc. at those conditions at various temperatures. If the amount of addition of Ag, that is, the amount of addition of Ag2O to the sample weight, is 5 mass % or less, it is known that, conditional on a structure being obtained where Ag particles do not precipitate at 970° C. or less, the Ag grains change in shape to disk shapes or spherical shapes.

CITATION LIST

Patent Literature

PLT 1. Japanese Patent Publication No. 2-153803A
PLT 2. Japanese Patent Publication No. 5-193938A
PLT 3. Japanese Patent Publication No. 5-279031A

Nonpatent Literature

NPLT 1. Y. Nakamura et al., Physica. C, 294 (1988) 302-315

SUMMARY OF INVENTION

Technical Problem

The performance of a bulk superconductor (critical current density characteristic) changes not only by external conditions like the temperature and magnetic field, but also by the amount of addition of the 211 phases, particle size distribution, oxygen annealing conditions, presence of any addition of Ag, amount of addition of Ag, and other manufacturing conditions of the material itself. These design elements of the material are used suitably optimized in accordance with the usage conditions.

When applied to a bulk superconducting magnet, cracking of the material due to the hoop force during magnetization or after magnetization is suppressed, it is necessary to fit a metal ring over the cuter circumference to reinforce the magnet. At this time, it is necessary to perform precision working so as to reduce as much as possible the clearance between the bulk material and the reinforcing ring and uniformly reinforce the bulk material. Furthermore, basically the 123 phase of a superconducting bulk material is a material which has a two-dimensional crystal structure and which easily cleaves and cracks. Therefore, if causing Ag particles to disperse in the superconducting bulk material, this is also important in the sense of suppressing chipping and other defects at the time of precision working and preventing the formation of starting points of cracking.

For example, PLT 3 proposes to control the concentration of Ag in a bulk superconductor by preparing shaped articles changed in amount of addition of AgO powder and stacking, melting, and solidifying these to thereby obtain a bulk superconductor controlled in Ag concentration.

The workability of a material in which Ag particles are made to precipitate in this way is improved over a material in which they are not added, but the critical current density changes due to external conditions such as the temperature and magnetic field, so depending on the external conditions, sometimes a material in which Ag particles have not precipitated is superior to a material in which they are added. A conventional material in which Ag particles have precipitated is not always superior in both workability and critical current density compared with a material in which they are not added. All of PLTs 1 to 3 have as their objects to obtain large-sized crystal grains having high critical current density, but do not propose single crystal bulk superconductors also provided with workability.

That is, a bulk oxide superconductor, oxide superconductor current lead element, and bulk oxide superconductor having a high workability and high critical current density characteristic regardless of the external conditions have been demanded.

In particular, when applied to a bulk superconducting magnet, the reinforcing-use outer circumference part has to be precisely worked. For this reason, a superconducting bulk material in which Ag particles are dispersed at least at the periphery of the bulk superconductor magnet and Ag particles are not present at the center part is necessary. Further, to obtain a current lead element with a low contact resistance and small heat conduction, a superconducting bulk material in which Ag particles precipitate only at the two end parts and in which Ag particles are not present at the center part is necessary.

Therefore, the present invention has as its object a bulk superconductor of a structure in which parts where Ag particles are present and parts where they are not present adjoin each other. In particular, a bulk superconductor of a structure in which parts where Ag particles are present straddle parts where Ag particles are not present is desired.

Solution to Problem

The inventors engaged in intensive studies and a result obtained the following findings: They discovered that when producing an RE-based bulk oxide superconductor, if making the amount of Ag added to the precursor of the bulk oxide superconductor 5.0 mass % or less and using the QMG method to produce a magnet, it is possible to eliminate particle size 1 to 10 μm Ag particles in the structure of the RE-based bulk oxide superconductor near the seed crystal and for regions where particle size 1 to 10 μm Ag particles are dispersed and precipitate at the surrounding parts.

That is, the inventors discovered that a structure where parts where Ag particles are present and parts where Ag particles are not present adjoin each other is formed. From a three-dimensional viewpoint, a structure is formed where a part where Ag particles are present forms the surface and a part where Ag particles are not present forms the center part. That is, the inventors discovered a structure with a part where Ag particles are not present surrounds a part where Ag particles are present is formed.

Furthermore, they discovered that by working a bulk superconductor obtained by arranging parts where Ag particles are present at parts requiring more workability, a bulk superconductor which secures high current density while having the necessary workability is obtained. In particular, they discovered that it is possible to obtain a structure were parts where Ag particles are present sandwich parts where Ag particles are not present. The present invention was made based on these discoveries. The gist is as follows:

(1) An bulk oxide superconductor comprised of a single crystal-like $REBa_2Cu_3O_{7-x}$ phase in which $RE_2BaCuO_5$ phases and Ag particles are contained, which bulk oxide superconductor characterized by being of a structure comprising parts where Ag particles are present and parts where Ag particles are not present adjoining each other and having Ag particles of a particle size of 10 μm or less dispersed in it.

(2) The bulk oxide superconductor according to (1) being of a structure where the parts where Ag particles are present sandwich the parts were Ag particles are not present.

(3) The bulk oxide superconductor according to (1) being of a structure where the parts where Ag particles are present surround the parts were Ag particles are not present.

(4) The bulk oxide superconductor according to any one of (1) to (3) wherein the Ag particles have a particle size of 1 to 10 μm.

(5) The bulk oxide superconductor according to any one of (1) to (4) wherein the bulk oxide superconductor is bar shaped, the parts where Ag particles are present are arranged at the two end parts, and the region other than the end parts is made a part where Ag particles are not present.

(6) A method of production of the bulk oxide do superconductor comprising heating a precursor of a bulk oxide superconductor to form a semimolten state and bringing a seed crystal into contact with it to obtain a single crystal-like $REBa_2Cu_3O_{7-x}$ phase in which $RE_2BaCuO_5$ phases are finely dispersed, the method of production of the bulk oxide superconductor adding Ag: 0.5 to 5.0 mass % to the precursor of a bulk oxide superconductor and heating it to become a semimolten state, then bringing a seed crystal into contact with the semimolten state precursor and gradually cooling to make the precursor solidify into a single crystal shape.

(7) The method of production of the bulk oxide superconductor according to (6) further comprising working the bulk oxide superconductor into a bar shape so that parts where Ag is present sandwich a part where Ag is not present.

Advantageous Effects of Invention

According to the present invention, a bulk oxide superconducting magnet which can be worked at a high precision for reinforcing the outer circumference and which generates a high magnetic field can be more easily realized. Due to this, it is possible to obtain a bulk oxide superconductor or superconducting current lead which can generate a high magnetic field not obtainable by a normal permanent magnet and which is low in contact resistance and excellent in heat resistance. The industrial effect is tremendous.

BRIEF DESCRIPTION OF DRAWINGS

FIG. 1A is a conceptual view showing a bulk oxide superconductor grown from a seed crystal. FIG. 1B is a view showing the state of a cross-section at a broken line position of FIG. 1A.

FIG. 2A is a conceptual view showing a bulk oxide superconductor grown from a seed crystal. FIG. 2B is a view showing the state of a cross-section at a position of a broken line A of FIG. 2A. FIG. 2C is a view showing the state of a cross-section at a position of a broken line B of FIG. 2A.

FIG. 3A is a view showing an example of a bulk oxide superconductor grown from a seed crystal (Ag: 3 mass % added. Diameter: about 37 mm). FIG. 3B is a view showing the state of a cross-section at positions of 5 mm and 10 mm from the top of FIG.

3A. FIG. 3C is a view showing a bar-shaped sample worked so that the two end parts become regions where Ag particles precipitate.

FIG. 4A is a view showing an example of a bulk oxide superconductor grown from a seed crystal (Ag: 4 mass % added. Diameter: about 45 mm). FIG. 4B is a view showing the state of a cross-section at positions of 5 mm and 10 mm from the top of FIG. 4A. FIG. 4C is a view showing a bar-shaped sample worked so that the two end parts become regions where Ag particles precipitate.

DESCRIPTION OF EMBODIMENTS

Figure 1:
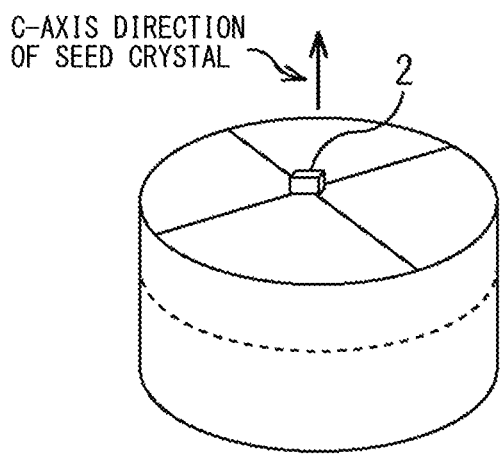
FIGS. 1A and 1B are views showing an example of the appearance of a bulk oxide superconductor prepared from a seed crystal by a relatively small amount of addition of Ag and an example of the state of distribution of Ag particles at the cross-section.
Figure 1:
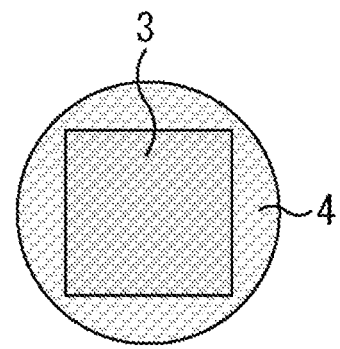

The bulk oxide superconductor used in the present invention is preferably one having the structure of single crystal-like $REBa_2Cu_3O_{7-x}$ in which nonsuperconducting phases such as $RE_2BaCuO_5$ phases (211 phases) etc. are finely dispersed (so-called QMG material). Here, "single crystal-like" means not a perfect single crystal, but a state including defects not obstructing practical use such as small inclination grain boundaries. The RE at the $REBa_2Cu_3O_{7-x}$ phase (123 phase) and $RE_2BaCuO_5$ phases (211 phase) is a rare earth element selected from Y, La, Nd, Sm, Eu, Gd, Dy, Ho, Er, Tm, Yb, and Lu and combinations of the same. The 123 phase containing La, Nd, Sm, Eu, and Gd is outside the 1:2:3 stoichiochemical composition. Ba is partially substituted at the RE sites. Further, in the nonsuperconducting phases, that is, 211 phases, as well, it is known that La and Nd are somewhat different from Y, Sm, Eu, Gd, Dy, Ho, Er, Tm, Yb, and Lu, the ratio of metal elements becomes a non-stoichiochemical composition, and the crystal structure differs.

The above-mentioned substitution by the Ba element tends to cause the critical temperature to decline. Further, in an environment with a smaller oxygen partial pressure, substitution by the Ba element tends to be suppressed.

The 123 phase is formed by a peritectic reaction between the 211 phases and a liquid phase comprised of a composite oxide of Ba and Cu, that is, the reaction of

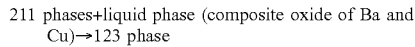
211 phases+liquid phase (composite oxide of Ba and Cu)→123 phase

Further, due to this peritectic reaction, the temperature Tf at which the 123 phase is formed (Tf: 123 phase formation temperature) is substantially related to the ion radius of the RE element and becomes lower along with the reduction in the ion radius. Further, the Tf tends to fall along with a low oxygen atmosphere and addition of Ag.

A material comprised of a single crystal-like 123 phase in which 211 phases are finely dispersed can be formed since when the 123 phase is grown by crystal growth, the unreacted 211 grains are left in the 123 phase. That is, a QMG material can be formed by a reaction shown by:

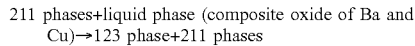
211 phases+liquid phase (composite oxide of Ba and Cu)→123 phase+211 phases The fine dispersion of the 211 phases in the QMG material is extremely important from the viewpoint of improvement of the critical current density (Jc). By adding a fine amount of at least one of Pt, Rh, or Ce, particle growth of the 211 phases in the semimolten state (state comprised of 211 phases and liquid phase) is suppressed and as a result the 211 phases in the material are refined to about 1 μm. The amount of addition, from the viewpoint of the amount at which the effect of refining appears and the material costs, is preferably Pt: 0.2 to 2.0 mass %, Rh: 0.01 to 0.5 mass %, and Ce: 0.5 to 2.0 mass %. The added Pt, Rh, and Ce partially form solid solutions in the 123 phase. Further, the elements which cannot form solid solutions form composite oxides with Ba and Cu and are scattered in the QMG material.

Further, a bulk oxide superconductor forming a magnet has to have a high critical current density even in a magnetic field. To satisfy this condition, a single crystal-like 123 phase not containing large inclination grain boundaries forming weak bonds in a superconductive manner is necessary. Further, to obtain a high Jc characteristic, pinning centers for stopping the action of the magnetic flux become necessary. What function as the pinning centers are the finely dispersed 211 phases. These are preferably dispersed in large numbers in finer form. As stated above, Pt, Rh, and Ce act to promote the refining of the 211 phases. Further, as pinning sites, the possibility of $BaCeO_3$, $BaSiO_3$, $BaGeO_3$, $BaSnO_3$, etc. is known. Further, the 211 phases and other nonsuperconducting phases finely disperse in the easily cleavable 123 phase and thereby mechanically strengthen the superconductor and have important actions in the bulk material.

The ratio or the 211 phases in the 123 phase is preferably 5 to 35 vol % from the viewpoint of the Jc characteristic and mechanical strength. Further, a QMG material generally contains 50 to 500 μm or so voids in 5 to 20 vol %. Furthermore, when adding Ag, depending on the amount of addition, the case is included of 1 to 500 μm or so Ag or Ag compounds in over 0 vol % to 25 vol %.

Further, the oxygen loss (x) of the material after crystal growth shows the temperature change of the semiconductor resistance at about 0.5. Depending on the RE, by annealing at 350° C. to 600° C. at 100 hours or so in an oxygen atmosphere, oxygen is taken into the material, the oxygen loss (x) becomes 0.2 or less, and a good superconducting characteristic is exhibited.

Effect of Addition of Ag

Next, the effect of addition of Ag in the QMG material will be explained. In general, it is important to efficiently and inexpensively produce a good quality superconducting bulk material suitable for the conditions of use. It is possible to say that causing fine dispersion of expensive Ag only at required parts is an economically advantageous technique.

However, to make Ag segregate at specific locations of an Ag bulk oxide superconductor, advanced crystal growth technology keeping down the amount of addition of Ag and anticipating changes in crystal growth temperature is also necessary. It is believed there has not been such a technical idea in the past. Further, when applied to a current lead element or other current carrying device, it is necessary to coat the electrode parts of the current carrying device with Ag to lower the contact resistance, so it is desirable to make Ag particles disperse in the material. However, on the other hand, it is necessary to suppress the entry of heat between electrodes of a current carrying device, so it is necessary to eliminate Ag particles with a large heat conductivity.

The inventors studied in detail the amount of addition of Ag, the heat treatment conditions, and the crystal growth process and investigated in depth and elucidated the segregation behavior of Ag in a material to thereby reach the present invention. When the amount of addition of Ag in the 123 phase and 211 phases, mixed powder of Ag or $Ag_2O$ powder, or precursor of the shaped article, that is, bulk oxide superconductor, is less than 5 mass %, Ag dissolves in the liquid phase when heated to a semimolten state. Further, they discovered that if bringing a seed crystal into contact with this liquid phase to cause crystal growth, Ag particles will not segregate near the seed crystal. Furthermore, along with crystal growth, the concentration of Ag in the liquid phase rises. For example, in the case of a Gd-based material, the inventors discovered that if the concentration of Ag in the liquid phase exceeds about 5 mass %, Ag particles will precipitate.

In the semimolten state before crystal growth [211 phases+liquid phase (composite oxide of Ba and Cu)], Ag dissolves in the liquid phase to a certain extent. For example, when mixing a Gd-based 123 phase powder and a Gd-based 211 powder in a 3:1 ratio and heating them to a semimolten state, the amount of Ag dissolving in the liquid phase component is about 5 mass % of the mixed powder. This amount changes depending on the amount and composition of the liquid phase in the semimolten state. The greater the liquid phase component, the greater the amount of Ag dissolved. Further, there is also somewhat of a dependency on the crystal growth temperature. The higher the crystal growth temperature, the greater the amount of Ag dissolved tends to become.

Therefore, for example, in the case of the above Gd-based material with an amount of addition of Ag of 3 mass %, since the amount of addition of Ag is less than 5 mass %, the added Ag completely dissolves in the liquid phase. Next, when bringing a seed crystal into contact with this from this state to cause crystal growth, at the initial stage of crystal growth, as explained below, crystal growth (peritectic reaction) proceeds in the state with no Ag particles contained.

211 phase+liquid phase (composite oxide of Ba and Cu)→123 phase

At this time, almost no Ag forms a solid solution in the crystal phase, so the concentration of Ag in the liquid phase increases along with the crystal growth. If crystal growth proceeds and the concentration of Ag in the precursor exceeds about 5 mass %, 1 to 10 μm or so fine Ag particles precipitate from the liquid phase and are taken into the crystal phase. At this time, a structure is obtained in which 1 to 10 μm or so fine Ag particles are dispersed in a volume ratio of several percent. Due to the above, the upper limit of the concentration of Ag in the precursor (amount of addition) is made 5 mass %. To secure many parts where Ag particles are not present, it is better to lower the Ag concentration, but if doing so, the workability is sacrificed. Therefore, the lower limit of the Ag concentration is made 0.1 mass %. To secure such an effect, the upper limit is preferably made 4.8 mass %, more preferably made 4.6 mass %. Similarly, the lower limit is preferably made 0.5 mass %, more preferably is made 1 mass %.

Due to the above process, it is possible to obtain a structure where parts where Ag particles are present and parts where Ag particles are not present adjoin each other. Furthermore, viewed three-dimensionally, it is possible to obtain a structure in which parts where Ag particles are present surround parts where Ag particles are not present. Note that, here, the "dispersion" means the state where the precipitated Ag particles are present at certain extents of intervals from each other without aggregating.

For example, when placing a single seed crystal 2 on the surface of the center part of a single bulk material (precursor) 1 and growing a crystal such as shown in FIG. 1A, at the initial stage of crystal growth, that is, at the bulk, the center part of the surface does not contain Ag particles, but a material is obtained where the peripheral parts contain 1 to 10 μm or so fine Ag particles. Further, the crystal growth proceeds along with rectangular facets, so due to such a series of processes of crystal growth, regions containing fine Ag particles 4 are formed around the rectangular regions not containing Ag particles 3 shown in FIG. 1B.

The particle size of Ag particles is a relatively fine 1 to 3 μm or so near the boundaries between the regions containing Ag particles and regions not containing Ag particles, but the particle size of the Ag particles tends to become larger the further from the boundaries. This is because in the region far from the boundaries, the saturated state of the Ag at the liquid phase is held for a long period of time and as a result nuclei for precipitation of Ag particles easily form and Ag particles grow starting from these nuclei, so the particle size becomes larger. In the regions far from the comparative boundaries, many Ag particles of a particle size of 10 μm or so are seen. Due to such a phenomenon, a situation arises where 1 to 10 μm or so Ag particles surround regions not containing Ag particles.

The starting temperature of the crystal growth of a bulk oxide superconductor containing Ag changes by the amount of addition of Ag. For example, in the case of a Gd-based material, in the air atmosphere, the crystal growth temperature falls along with the amount of addition, e.g., when the amount of addition of Ag is 0 mass %, it is about 1040° C., when 1 mass %, it is about 1034° C., and when 2 mass %, it is about 1025° C. Further, the drop in crystal growth temperature tends to become saturated from an amount of addition of Ag near 7 mass %, e.g., when 5 mass %, it is about 1010° C., when 7 mass %, it is about 1004° C., and when 10 mass %, it is about 1004° C.

The crystal growth of the 123 phase is crystal growth while maintaining relatively stable facets when the difference of the starting temperature of this crystal growth and the actual growth temperature, that is, the supercooling degree, is 10° C. or less, so a good quality bulk oxide superconductor is obtained. Therefore, for example, for a material to which Ag: 2 mass % is added, if growing the crystal to the shaped article as a whole, if making the furnace temperature at the initial stage of crystal growth a condition several percent lower than 1025° C., the Ag is concentrated at the surrounding parts of the bulk material. Further, to obtain a structure in which Ag particles are dispersed, gradually cooling down to at least several degrees centigrade lower than 1010° C. is necessary. It is necessary to produce a bulk oxide superconductor while maintaining a good crystallinity while lowering the crystal temperature in accordance with the concentration of Ag due to crystal growth. A material in a condition where the starting temperature of crystal growth does not change along with crystal growth, for example, a material to which Ag: 10 mass % is added, differs in heat treatment (method of production) on this point.

On the other hand, for example, in the case of a Gd-based material with an amount of addition of Ag of 5 mass % to less than 10 mass %, part of the added Ag dissolves in the liquid phase, but part is trapped as liquid Ag particles in the shaped article in the semimolten state. The size of the Ag particles at this time is determined by the size of the Ag particles added to the mixed powder of the 123 powder and the 211 phase powder, the size of the $Ag_2O$ powder, or the size of the secondary particles formed by aggregation of these particles. With normal sieving etc., most particles become 30 to 300 μm or so.

If crystal growth starts by such a composition, at the crystal growth ends, the Ag which dissolved in the liquid phase is absorbed at the relatively large 30 to 300 μm or so Ag particles of the liquid. For this reason, 1 to 10 μm or so fine Ag particles become hard to precipitate. Almost all is taken into the crystal phase as large 30 to 300 μm or so Ag particles. As a result, a bulk oxide superconductor in which 30 to 300 μm or so Ag particles are dispersed is obtained.

Further, for example, if the above Gd-based material with an amount of addition of Ag of 5 mass %, the added Ag substantially completely dissolves in the liquid phase. Next, when growing a crystal from a seed crystal by such a composition, if holding the rectangular facets, 1 to 10 μm or so fine Ag particles are precipitated at the regions grown in the [100], [010], [001] directions at the facet surface and the rectangular region of the center part.

Figure 2:
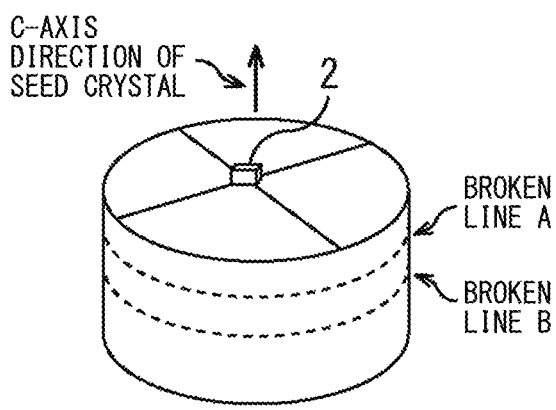
FIGS. 2A to 2C are views showing an example of the appearance of a bulk oxide superconductor prepared from a seed crystal by an amount of addition of Ag of over 5 mass % and an example of the state of distribution of Ag particles at the cross-section.
Figure 2:
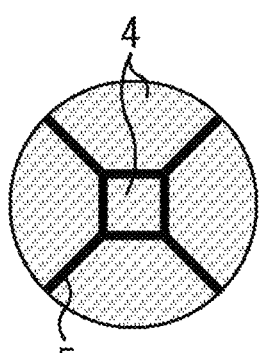
Figure 2:
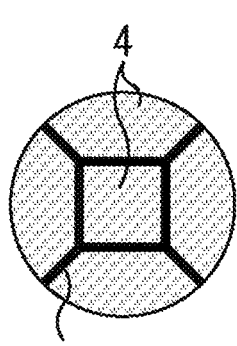

In this regard, at the parts of the corners of the crystal phases, that is, the nearby regions grown in the [110], [101], [111] directions (width 0.2 to 1.0 mm), regions in which 1 to 10 μm or so fine Ag particles are not contained are formed. For example, as shown in FIG. 2A, when using a seed crystal 2 for crystal growth, a structure such as shown in FIGS. 2B and 2C having regions 4 containing fine Ag particles and straight line regions 5 not containing Ag particles is formed. In the straight line regions 5 not containing Ag particles, it appears that either the Ag precipitated along with the crystal growth again dissolves into the liquid phase or the precipitated liquid Ag particles are pushed by the facets of the corner parts.

The crystal phase is black in color, while the Ag particles have a metallic luster, so by roughly polishing the sample surface by abrasive paper etc., it is possible to visually discriminate between regions containing Ag particles and regions not containing them. In relatively small-sized bulk oxide superconductors as well, it is possible to discern any respective 100 mm$^3$ or so regions as well.

The Ag particles dispersed in the material act to suppress the progression of cracks in the crystal phase, so by adding Ag into a superconductor, it is considered that there is a tendency for the mechanical strength to increase. Further, there is the effect of suppressing the progression of cracks in the crystal phase, so at the time or grinding and cutting, the workability of the material increases and the resistance to chipping and other defects increases. For this reason, when applied to a bulk magnet, when precisely working the outer circumferential part of the bulk oxide superconductor by a 0.1 mm or so precision for reinforcement, by the outer ring, it is extremely desirable to have a structure in which Ag is dispersed.

Further, by working this bulk oxide superconductor into a bar shape, it is possible to prepare an oxide superconductor current lead element where the center part does not contain Ag particles, but the peripheral parts contain 1 to 10 μm or so fine Ag particles. At this time, the two end parts where the Ag coating is provided have Ag particles finely dispersed, while the center part does not contain Ag particles. In this way, it is possible to apply an Ag coating at the electrode parts of a current carrying device at the two end parts to efficiently lower the contact resistance and sufficiently suppress entry of heat between electrodes.

EXAMPLES

Example 1

Purity 99.9% reagents $Gd_2O_3$, $BaO_2$, and CuO were mixed to give a molar ratio of Gd:Ba:Cu metal elements of 10:14:20 (that is, molar ratio of 123 phase:211 phases of final structure of 3:1). Furthermore, a mixed powder to which $CeO_2$: 1.0 mass % and $Ag_2O$: 3 mass % (converted to Ag of about 2.8 mass %) were added was prepared. The mixed powders were calcined once at 900° C. for 8 hours. The calcined powders were filled in inside diameter 50 mm cylindrical molds and formed into thickness about 30 mm disk shapes to prepare Gd-based shaped articles. Further, $Sm_2O_3$ and $Yb_2O_3$ were used by the same method as the above shaped articles to prepare thickness 4 mm Sm-based and Yb-based disk shape shaped articles. Further, the shaped articles were compressed by an isostatic hydraulic press by about 100 MPa.

Further, in the preparation of comparative materials of Sm-based, Yb-based, Gd-based shapes (precursors), shaped articles of precursors not containing Ag (Sm-based, Yb-based, Gd-based) prepared by not adding $Ag_2O$ were prepared.

Next, the precursors of the invention example were stacked on an alumina support in the order of the Sm-based, Yb-based, and Gd-based shaped articles (precursors) from the bottom and were placed in a furnace. These precursors were raised in temperature in the air up to 700° C. over 15 hours, up to 1040° C. over 160 hours, and further up to 1120° C. over 1 hour, held there for 30 minutes, then lowered in temperature down to 1030° C. over 1 hour and held there for 1 hour. During that time, a Sm-based seed crystal prepared in advance was used and the seed crystal placed on the semimolten state precursors. Regarding the orientation of the seed crystal, the cleaved surface was placed on the precursors so that the c-axis became the normal line of the disk shaped precursor. After this, the assembly was cooled in the air down to 1025 to 1000° C. over 120 hours to grow the crystal. Further, the assembly was cooled down to room temperature over about 35 hours to obtain an outside diameter about 37 mm, thickness about 22 mm Gd-based single crystal-like bulk oxide superconductor.

Further, a comparative example of precursors not containing Ag were also similarly placed in a furnace. After heat treatment up to similar seeding, they were cooled down to 1045 to 1025° C. over 120 hours to grow a crystal and thereby similarly obtain a comparative material of a Gd-based single crystal-like bulk oxide superconductor.

Figure 3:
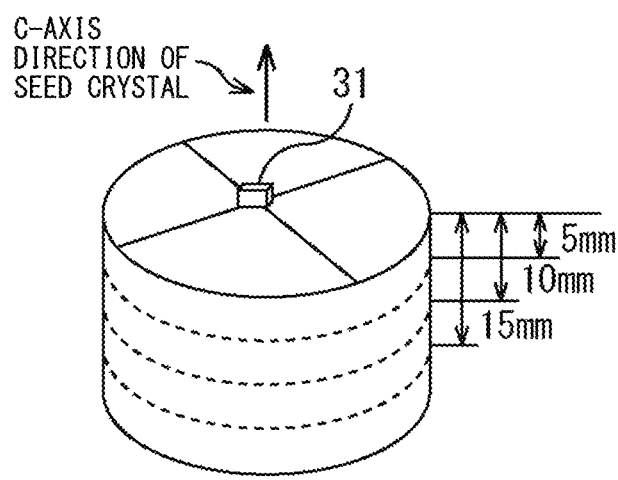
FIGS. 3A to 3C are conceptual views for explaining a bulk oxide superconductor prepared in Example 1 and a current lead element cut out in a bar shape.
Figure 3:
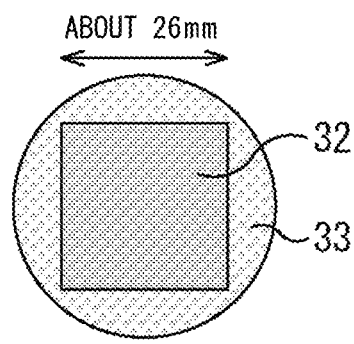
Figure 3:
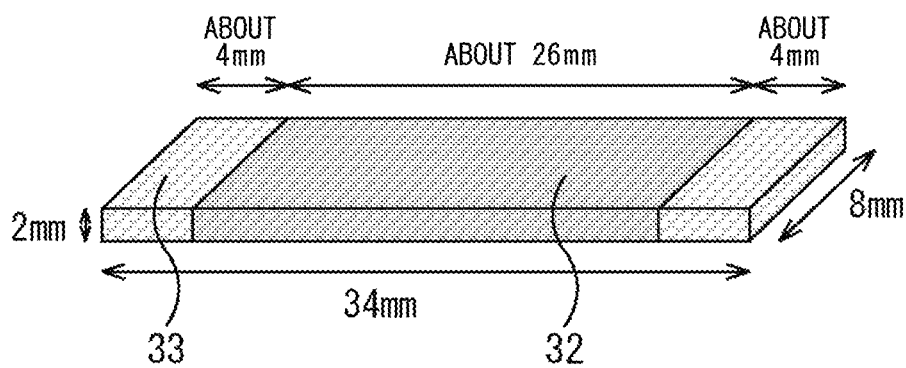

Next, the obtained sample of the invention example, as shown in FIG. 3A, was cut at positions of 5 mm, 10 mm, and 15 mm from the top surface carrying the seed crystal 31, annealed by oxygen annealing (held in an oxygen stream at 400° C. for 80 hours), then polished on the surfaces and observed in structure. As a result, the pieces respectively had structures of single crystal-like $GdBa_2Cu_3O_{y-x}$ phases in which $Gd_2BaCuO_5$ phases (211 phases) were finely dispersed. At the positions of 5 mm and 10 mm from the top surfaces, as shown in FIG. 3B, regions 32 not containing Ag particles could be observed in the approximately 26 mm square regions at the center parts of the samples while regions 33 in which fine Ag particles are contained could be observed at the peripheries. That is, in about 3400 mm$^3$ regions, almost no precipitation of Ag particles was seen while in the surrounding about 2000 mm$^3$ regions, the dispersion of Ag was seen. The particle size of most of the Ag particles was 1 to 10 μm, while the area ratio of the Ag particles was about 5%. Further, the closer to the peripheral parts, the larger the particle size tended to become. However, at the 15 mm position, the facets became disturbed and recessed facets were formed in the crystal growth direction, so it was confirmed that Ag particles precipitated at the center parts together with the peripheral parts.

Next, a sample cut out from a position 5 to 10 mm from the top surface was worked to an outside diameter 36.0+0.0 to −0.1 mm and thickness 4.5±0.1 mm precision. The outer circumferential part contained Ag particles, so the sample could be worked without chipping. Further, to this sample, an inside diameter 36.0+0.1 to −0.0 mm, outside diameter 40.0±0.1 mm, height 4.5±0.1 mm SUS ring was fit and fastened by a resin. Next, this was cooled in a 2.0 T magnetic field in liquid nitrogen (77K). The outside magnetic field was removed, then the trapped magnetic flux distribution was measured whereupon a concentric magnetic flux density distribution and 1.2 T magnetic flux density were confirmed at the sample surface. Due to this, it could be confirmed that crystals of the superconducting phase (123 phase) were connected to the sample as a whole and the c-axes were aligned.

Further, a comparative example of the Gd-based sample not containing Ag was similarly cut out from a position of 5 to 10 mm from the top surface to obtain a sample which was similarly worked to an outside diameter of 36.0+0.0 to −0.1 mm and thickness 4.5±0.1 mm precision, but chipping was confirmed in three locations. Further, this sample was similarly measured for trapped magnetic flux distribution, whereupon the 0.95 T maximum magnetic flux density was confirmed. Due to this comparative experiment, it could be confirmed that the material of the invention example is better than the comparative material.

Next, a sample of the invention example cut out from a position 0 to 5 mm from the top surface, as shown in FIG. 3C, was shaved in thickness from about 5 mm to 2.0 mm, then a width 8 mm, length about 34 mm bar-shaped sample was cut out so that the two end parts became regions where Ag particles precipitated. Further, at the regions where Ag particles precipitated at the two end parts of this bar-shaped sample, thickness 2 μm Ag films were formed by sputtering. These were heat treated to make the Ag films closely contact the bar-shaped sample, then copper electrodes were soldered to these parts. The bar-shaped sample as a whole was sandwiched between glass fiber-reinforced plastic and screwed with them, then solidified by a resin to prepare a current lead. This current lead can carry 1500 A at 77K. It could be confirmed to sufficiently function as a current lead.

Example 2

Purity 99.9% reagents $Y_2O_3$, $BaO_2$, and CuO were mixed to give a molar ratio of Gd:Ba:Cu metal elements of 13:17:24 (that is, molar ratio of 123 phase:211 phase of final structure of 7:3). Furthermore, a mixed powder to which $CeBaO_3$: 1.5 mass % and $Ag_2O$: 4 mass % (converted to Ag about 3.7 mass %) were added was prepared. The mixed powders were calcined once at 900° C. for 8 hours. The calcined powders were filled into inside diameter 60 mm cylindrical molds and formed into thickness about 35 mm disk shapes to prepare Y-based shaped articles. Further, $Sm_2O_3$ and $Yb_2O_3$ were used by the same method as the above shaped articles to prepare thickness 4 mm Sm-based and Yb-based disk shape shaped articles. Furthermore, the shaped articles were compressed by an isostatic hydraulic press by about 100 MPa.

Further, in the preparation of comparative materials of Sm-based, Yb-based, Y-based shapes (precursors), shaped articles of precursors not containing Ag (Sm-based, Yb-based, Gd-based) prepared by not adding $Ag_2O$ were prepared.

Next, the precursors of the invention example were stacked on an alumina-based support in the order of Sm-based, Yb-based, and Y-based shapes (precursors) from the bottom and were placed inside a furnace. These precursors were raised in temperature in the atmosphere up to 700° C. over 15 hours, up to 1040° C. over 160 hours, and up to 1100° C. over 1 hour and held there for 30 minutes, then were lowered in temperature down to 1020° C. over 1 hour and held there for 1 hour. During that time, Sm-based seed crystal prepared in advance was used and the seed crystal placed on the semimolten state precursors. Regarding the orientation of the seed crystal, the cleaved surface was placed on the precursors so that the c-axis became the normal line of the disk shaped precursor. After this, the assembly was cooled in the air down to 990 to 970° C. over 140 hours to grow the crystal. Further, the assembly was cooled down to room temperature over about 35 hours to obtain an outside diameter about 45 mm, thickness about 26 mm Y-based single crystal-like bulk oxide superconductor.

Further, a comparative example of precursors not containing Ag were similarly arranged in a furnace, were heated treated until similar seeding, then were cooled down to 1005 to 990° C. over 140 hours to grow a crystal and similarly obtain a comparative example of a Y-based single crystal-like oxide superconducting material.

Figure 4:
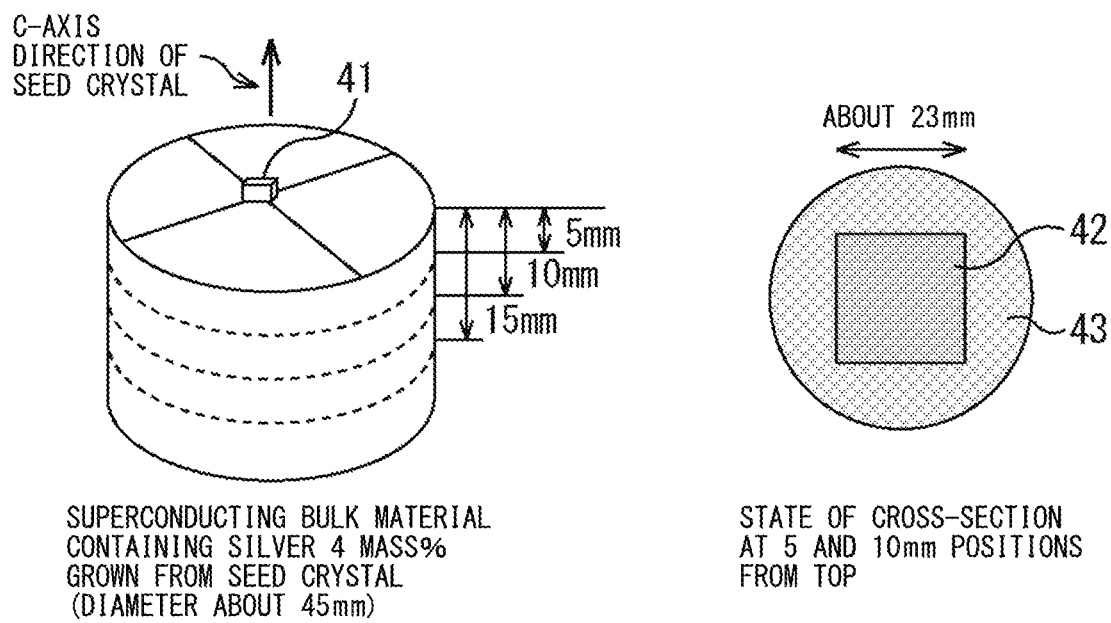
FIGS. 4A to 4C are conceptual views for explaining a bulk oxide superconductor fabricated in Example 2 and a current lead element cut out in a bar shape.
Figure 4:
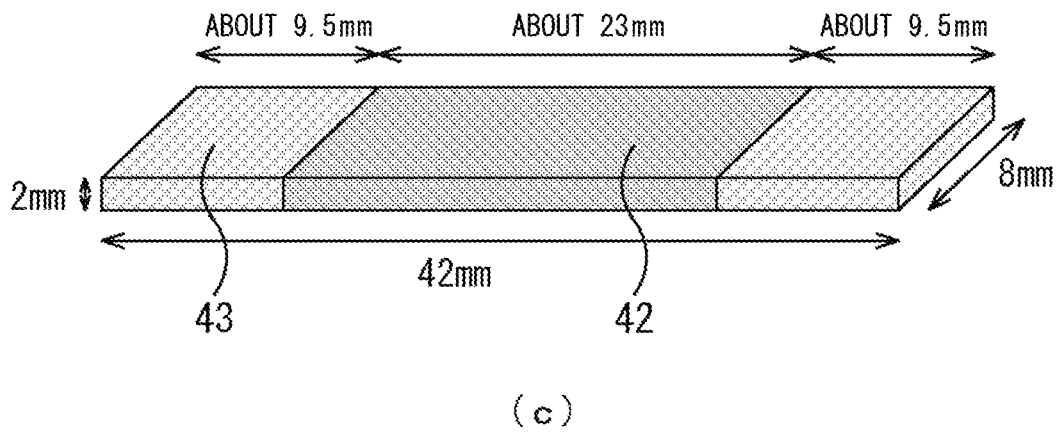

Next, the obtained sample of the invention example, as shown in FIG. 4A, was cut at positions of 5 mm, 10 mm, and 15 mm from the top surface carrying the seed crystal 41, annealed by oxygen annealing (held in oxygen stream at 400° C. for 80 hours), then polished on the surfaces and observed in structure. As a result, the pieces respectively had structures of single crystal-like $YBa_2Cu_3O_{7-x}$ phases in which $Y_2BaCuO_5$ phases (211 phases) were finely dispersed. At the positions of 5 mm and 10 mm from the top surfaces, as shown in FIG. 4B, regions 42 not containing Ag particles could be observed in the approximately 23 mm square regions at the center parts of the samples while regions 43 in which fine Ag particles are contained could be observed at the peripheries. That is, in about 2600 $mm^3$ regions, almost no precipitation of Ag particles was seen while in the surrounding about 7600 $mm^3$ regions, the dispersion of Ag was seen. The particle size of most of the Ag particles was 1 to 10 μm, while the area ratio of the Ag particles was about 5%. Further, the closer to the peripheral parts, the larger the particle size tends to become. Near the sample surface, 20 μm or so particles could also be seen. However, at the 15 mm position, the facets became disturbed and recessed facets are formed in the crystal growth direction, so it was confirmed that Ag particles precipitated at the center parts together with the peripheral parts.

Next, a sample cut out from a position 5 to 10 mm from the top surface was worked to an outside diameter 44.0+0.0 to −0.1 mm and thickness 4.5±0.1 mm precision. The outer circumference part contained Ag particles, so the sample could be worked without chipping. Further, to this sample, an inside diameter 44.0+0.1 to −0.0 mm, outside diameter 45.0±0.1 mm, height 4.5±0.1 mm SUS ring was fit and fastened by a resin. Next, this was cooled in a 3.0 T magnetic field in liquid nitrogen (77K). The outside magnetic field was removed, then the trapped magnetic flux distribution was measured whereupon a concentric magnetic flux density distribution and 1.25 T magnetic flux density were confirmed at the sample surface. Due to this, it could be confirmed that crystals of the superconducting phase (123 phase) were connected to the sample as a whole and the c-axes were aligned.

Further, a comparative example of the Y-based sample not containing Ag was similarly cut out from a position of 5 to 10 mm from the top surface to obtain a sample which was then similarly worked to an outside diameter 44.0+0.0 to −0.1 mm and thickness 4.5±0.1 mm precision, but chipping was confirmed at five locations. Further, this sample was similarly measured for trapped magnetic flux distribution, whereupon the 1.10 T maximum magnetic flux density was confirmed. Due to this comparative experiment, it could be confirmed that material of the invention example is better than the comparative material.

Next, a sample of the invention example cut out from a position 0 to 5 mm from the top surface, as shown in FIG. 4C, was shaved in thickness from about 5 mm to 2.0 mm, then a width 8 mm, length about 42 mm bar-shaped sample was cut out so that the two end parts become regions in which Ag particles precipitated. Further, at the regions where Ag particles precipitated at the two end parts of this bar-shaped sample, thickness 2 μm Ag films were formed by sputtering. These were heat treated to make the Ag films closely contact the bar-shaped sample, then copper electrodes were soldered to these parts. The bar-shaped sample as a whole was sandwiched between glass fiber-reinforced plastic and screwed with them, then solidified by a resin to prepare a current lead. This current lead can carry 1500 A at 77K. It could be confirmed to sufficiently function as a current lead.

INDUSTRIAL APPLICABILITY

The bulk oxide superconductor according to the present invention can be utilized for a superconducting magnet. Further, a superconducting magnet can be applied to a linear motor or can be utilized as an alternative to current permanent magnets.

REFERENCE SIGNS LIST 2. seed crystal
3. rectangular region not containing Ag particles
4. region containing fine Ag particles
5. straight line region not containing Ag particles

The invention claimed is:

1. A method of production of a bulk oxide superconductor comprising heating a precursor of a bulk oxide superconductor to form a semimolten state and bringing a seed crystal into contact with it to obtain a single crystal-like $REBa_2Cu_3O_{7-x}$ phase in which $RE_2BaCuO_5$ phases are finely dispersed, said method of production of the bulk oxide superconductor comprising adding Ag: 0.5 to 4.6 mass % to said precursor of a bulk oxide superconductor and heating it to become a semimolten state, then bringing a seed crystal into contact with said semimolten state precursor and gradually cooling to make said precursor solidify into a single crystal shape.

2. The method of production of the bulk oxide superconductor according to claim 1 further comprising working said bulk oxide superconductor into a bar shape so that parts where Ag is present sandwich a part where Ag is not present.

* * * * *